(12) United States Patent
Reber

(10) Patent No.: US 8,883,639 B2
(45) Date of Patent: Nov. 11, 2014

(54) SEMICONDUCTOR DEVICE HAVING A NANOTUBE LAYER AND METHOD FOR FORMING

(75) Inventor: Douglas M. Reber, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 227 days.

(21) Appl. No.: 13/358,137

(22) Filed: Jan. 25, 2012

(65) Prior Publication Data

US 2013/0187274 A1 Jul. 25, 2013

(51) Int. Cl.
*H01L 23/48* (2006.01)

(52) U.S. Cl.
USPC ............ 438/675; 257/751; 257/E21.586; 257/E23.011; 257/E21.584; 257/762; 438/653

(58) Field of Classification Search
CPC .... B82Y 10/00; B82Y 30/00; Y10S 977/742; Y10S 977/842; H01L 2221/1094
USPC ............ 257/E39, E51.038–E51.04, E23.074, 257/E23.165, 751, 762
See application file for complete search history.

(56) References Cited

U.S. PATENT DOCUMENTS

| | | | |
|---|---|---|---|
| 7,084,062 B1 * | 8/2006 | Avanzino et al. | 438/685 |
| 7,592,248 B2 | 9/2009 | Ventzek et al. | |
| 2005/0218523 A1 * | 10/2005 | Dubin | 257/762 |
| 2006/0292861 A1 * | 12/2006 | Furukawa et al. | 438/627 |
| 2012/0049370 A1 * | 3/2012 | Wada et al. | 257/751 |

OTHER PUBLICATIONS

Awano, "Carbon Nanotube Technologies for LSI via Interconnects"; IEICE Trans. Electron.; Nov. 2006; pp. 1499-1503; vol. E89-C, No. 11; The Institute of Electronics, Information and Communication Engineers.
Li et al.; "Carbon Nanotube Interconnects: A Process Solution"; Proceedings of International Interconnect Technology Conference; 2003; pp. 271-272; IEEE.
Nihei et al.; "Electrical Properties of Carbon Nanotube Bundles for Future Via Interconnects"; Japanese Journal of Applied Physics; 2005; pp. 1626-1628; vol. 44, No. 4A; The Japanese Society of Applied Physics.
Nihei et al.; "Carbon Nanotube Vias for Future LSI Interconnects"; Interconnect Technology Conference; 2004; pp. 251-253; IEEE.
Srivastava et al.; "Performance Analysis of Carbon Nanotube Interconnects for VLSI Applications"; International Conference on Computer-Aided Design; Nov. 6-10, 2005; pp. 384-390; IEEE.

* cited by examiner

*Primary Examiner* — David Vu
*Assistant Examiner* — Jonathan Han
(74) *Attorney, Agent, or Firm* — Joanna G. Chiu; James L. Clingan, Jr.

(57) ABSTRACT

A method of forming a semiconductor device includes forming a first conductive layer over the substrate. A dielectric layer, having a first opening, is formed over the first conductive layer. A seed layer is deposited over the first dielectric layer and in the first opening. A layer is formed of conductive nanotubes from the seed layer over the first dielectric layer and over the first opening. A second dielectric is formed over the layer of conductive nanotubes. An opening is formed in the second dielectric layer over the first opening. Conductive material is deposited in the second opening.

12 Claims, 5 Drawing Sheets

SEMICONDUCTOR DEVICE HAVING A NANOTUBE LAYER AND METHOD FOR FORMING

BACKGROUND

1. Field

This disclosure relates generally to semiconductor processing, and more specifically, to a semiconductor device having a nanotube layer and method for forming.

2. Related Art

As semiconductor technology progresses towards smaller dimensions, metal interconnects become prohibitively resistive and more susceptible to reliability failures. For example, as via aspect ratios continue to increase, the filling of the via openings with metal becomes increasingly difficult. Furthermore, there is a need to make interlayer dielectrics having ever decreasing dielectric constant, k. The industry has pursued carbon containing low-k dielectrics; however, they introduce problems such as uncontrollable porosity and low structural integrity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A semiconductor device is formed in which a homogeneous nanotube layer operates as both a via conductor and an interlayer dielectric material at different locations. For example, a first plurality of conductive nanotubes of the nanotube layer operates as a via conductor while a second plurality of conductive nanotubes of the nanotube layer of the same nanotube layer simultaneously operates as an interlayer dielectric material. In one embodiment, the homogeneous nanotube layer is deposited with relatively tunable porosity and hence dielectric constant. A thin patterned dielectric deposited and patterned before the nanotube layer is used to define the via locations. Therefore, those portions of the nanotube layer which are to operate as a via conductor are defined by openings in the thin patterned dielectric layer underneath the nanotube layer. The remaining portions of the nanotube layer operate as the interlayer dielectric material. By using nanotubes for the conductive via, a conductive via with low electrical resistance, high thermal conductivity, and high mechanical stability can be achieved. Also, by using the nanotubes for the interlayer dielectric, a low-k dielectric can be achieved with high structural integrity. In this manner, a homogeneous nanotube layer may be used to provide both an improved conductive via and improved interlayer dielectric material.

Figure 1:
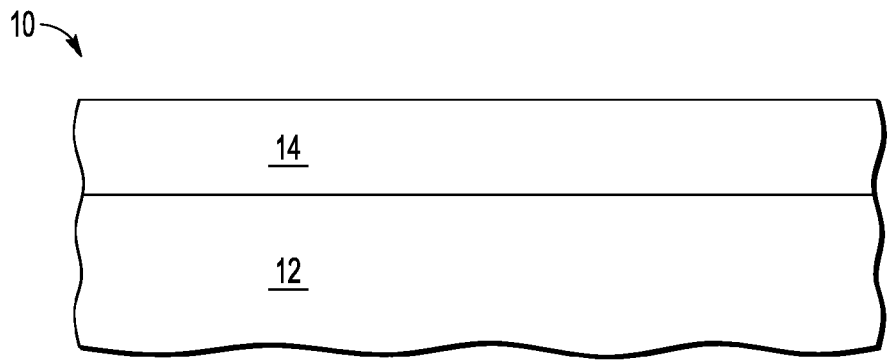
FIG. 1 illustrates a semiconductor device at a stage in processing, in accordance with one embodiment of the present invention.

FIG. 1 illustrates a semiconductor device 10 at a stage in processing. Semiconductor device 10 includes a conductive layer 14 formed over underlying layers 12. Underlying layers 12 may include a semiconductor substrate and any number of layers, which may include circuitry and interconnect layers, over the semiconductor substrate. The semiconductor substrate can be any semiconductor material or combinations of materials, such as gallium arsenide, silicon germanium, silicon-on-insulator (SOI), silicon, monocrystalline silicon, the like, and combinations of the above. In one embodiment, conductor layer 14 corresponds to a conductive line which is part of an interconnect layer of semiconductor device 10 to which a conductive via is to make electrical contact. In one embodiment, conductive layer 14 is copper. Alternatively, other metals may be used.

Figure 2:
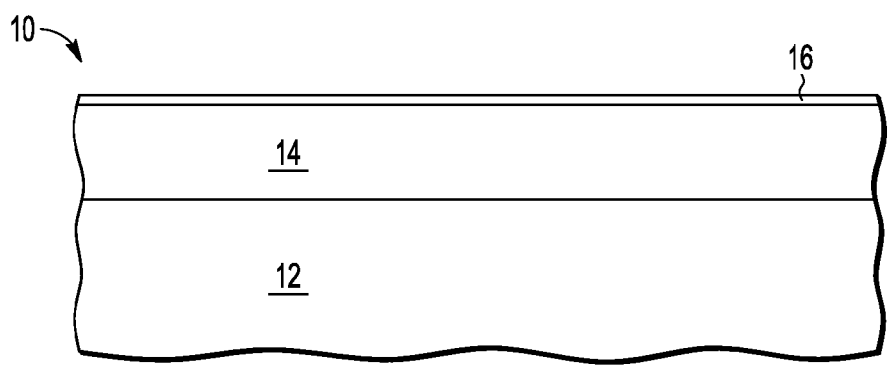
FIG. 2 illustrates the semiconductor device of FIG. 1 at a subsequent stage in processing, in accordance with one embodiment of the present invention.

FIG. 2 illustrates semiconductor device 10 of FIG. 1 at a subsequent stage in processing. In FIG. 2, a conductive layer 16 is formed over conductive layer 14. In one embodiment, conductive layer 16 includes a titanium barrier layer over conductive layer 14 and a tantalum contact layer over the titanium barrier layer. In alternate embodiments, other metals may be used in addition to or in place of titanium and tantalum. Furthermore, conductive layer 16 can include any number of conductive layers, including a material which provides an ohmic contact for the subsequently formed conductive via.

Figure 3:
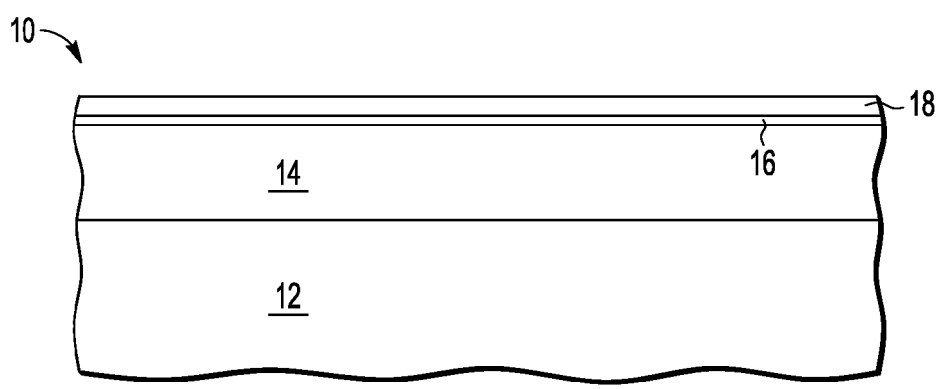
FIG. 3 illustrates the semiconductor device of FIG. 2 at a subsequent stage in processing, in accordance with one embodiment of the present invention.

FIG. 3 illustrates semiconductor device 10 of FIG. 2 at a subsequent stage in processing. In FIG. 3, a dielectric layer 18 is formed over conductive layer 16. In one embodiment, dielectric layer 18 may be formed by deposition. In one embodiment, dielectric layer has a thickness of less than or equal to 10 nanometers and may include an oxide or a nitride, such as, for example, $Si_3N_4$, SiON, etc. Dielectric layer 18 may also be a low-k silicon layer. Dielectric layer 18 may also include multiple layers.

Figure 4:
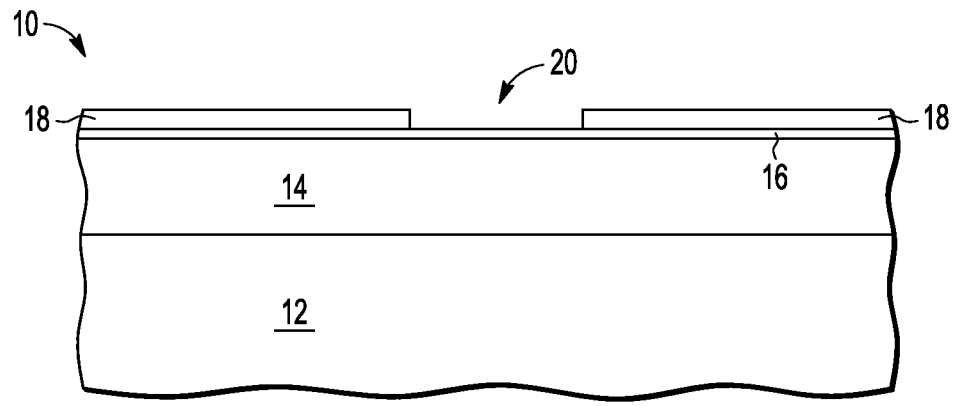
FIG. 4 illustrates the semiconductor device of FIG. 3 at a subsequent stage in processing, in accordance with one embodiment of the present invention.

FIG. 4 illustrates semiconductor device 10 of FIG. 3 at a subsequent stage in processing in which dielectric layer 18 is patterned to form an opening 20. Opening 20 extends through dielectric layer 18 to expose conductive layer 16. As will be described in more detail below, opening 20 defines a location of a conductive via of semiconductor device 10.

Figure 5:
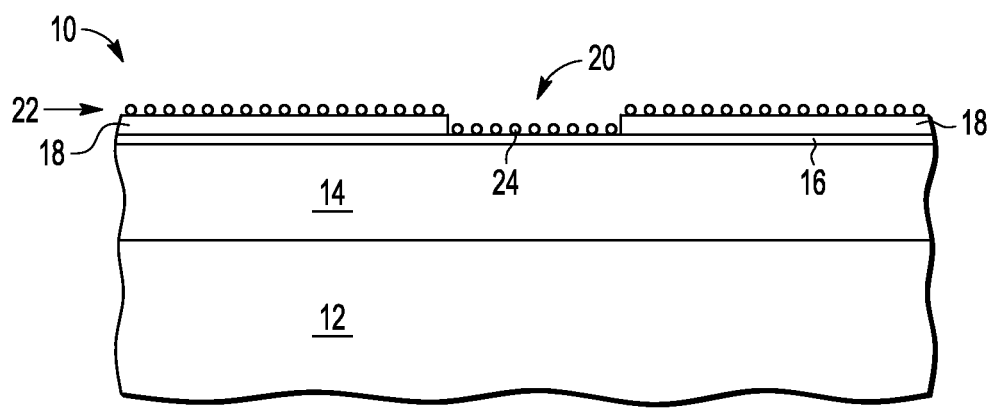
FIG. 5 illustrates the semiconductor device of FIG. 4 at a subsequent stage in processing, in accordance with one embodiment of the present invention.

FIG. 5 illustrates semiconductor device 10 of FIG. 4 at a subsequent stage in processing in which a seed layer 22 is formed over a top surface of dielectric layer 18 and an exposed top surface of conductive layer 16 within opening 20. In one embodiment, seed layer 22 is deposited non-conformally so as not to be formed on sidewalls of dielectric layer 18 of opening 22. Seed layer 22 includes a plurality of discrete seeds which are spaced apart, and thus isolated, from each other. Illustrated in FIG. 5 is an exemplary discrete seed 24. In one embodiment, seed layer 22 is cobalt, such that each discrete seed is cobalt. Alternatively, other materials or alloys may be used, such as, for example, palladium, platinum, or alloys thereof.

Figure 6:
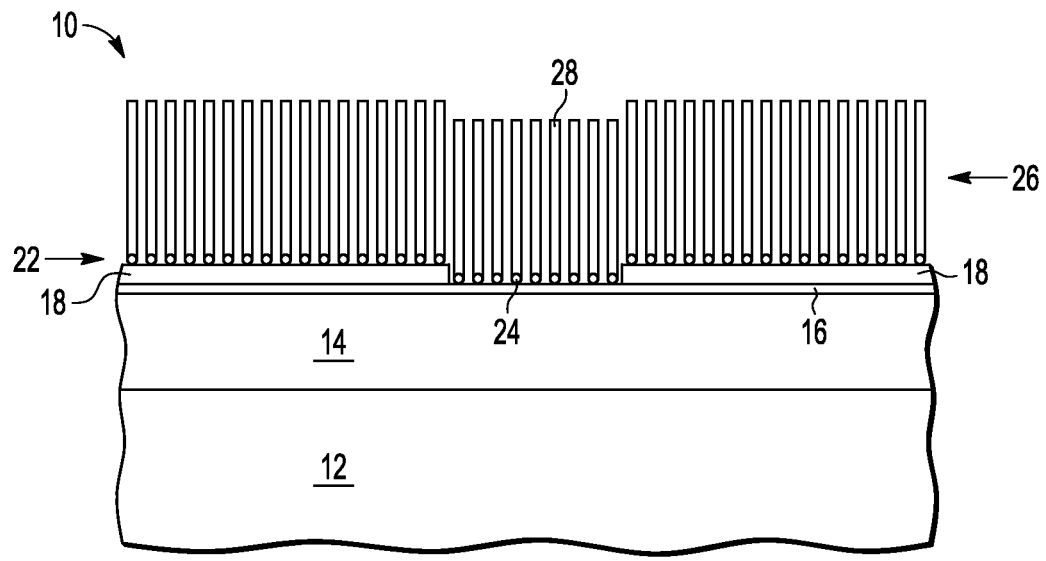
FIG. 6 illustrates the semiconductor device of FIG. 5 at a subsequent stage in processing, in accordance with one embodiment of the present invention.

FIG. 6 illustrates semiconductor device 10 of FIG. 5 at a subsequent stage in processing. In FIG. 6, a layer 26 of conductive nanotubes is formed as directed by seed layer 22. That is, a conductive nanotube, such as exemplary nanotube 28, is formed on each discrete seed of seed layer 22. For example, the conductive nanotubes may be formed using a gas phase deposition process at a temperature of less than 600 degrees Celsius, or preferably, less than 450 degrees Celsius. In one embodiment, conductive nanotubes 26 are formed of carbon. Alternatively, they may be formed of other materials, such as, for example, zinc oxide, titanium oxides, copper, boron nitride, and silicon. Layer 26 of conductive nanotubes is formed to a desired via height. Note that layer 26 of conductive nanotubes is a homogeneous layer which is uniform in structure and composition throughout. That is, each of the conductive nanotubes of layer 26 are of the same type, formed of the same material. Therefore, the conductive nanotubes are homogeneous. Also, note that the conductive nanotubes of layer 26 are simultaneously grown from the seeds of seed layer 22, both from the seeds over dielectric layer 18 and from the seeds over conductive layer 16 within opening 22.

Note that each nanotube of layer 26 is a conductive nanotube. A conductive nanotube is a nanotube which conducts through the center portion of the tube, along the length of the tube, and not perpendicular to the hoop of the tube. Therefore, referring to exemplary nanotube 28, current flows through the center portion of nanotube 28, perpendicular to the top surface of conductive layer 16 within opening 22. In contrast, a non-conductive nanotube is a nanotube which cannot conduct electricity through its center portion, along the length of the tube. Note that, for either conductive or non-conductive nanotubes, no electrons are conducted between laterally adjacent nanotubes. Therefore, within layer 26, current is not conducted laterally between conductive nanotubes in a direction that is substantially parallel to top surfaces of dielectric layer 18 and conductive layer 26.

Figure 7:
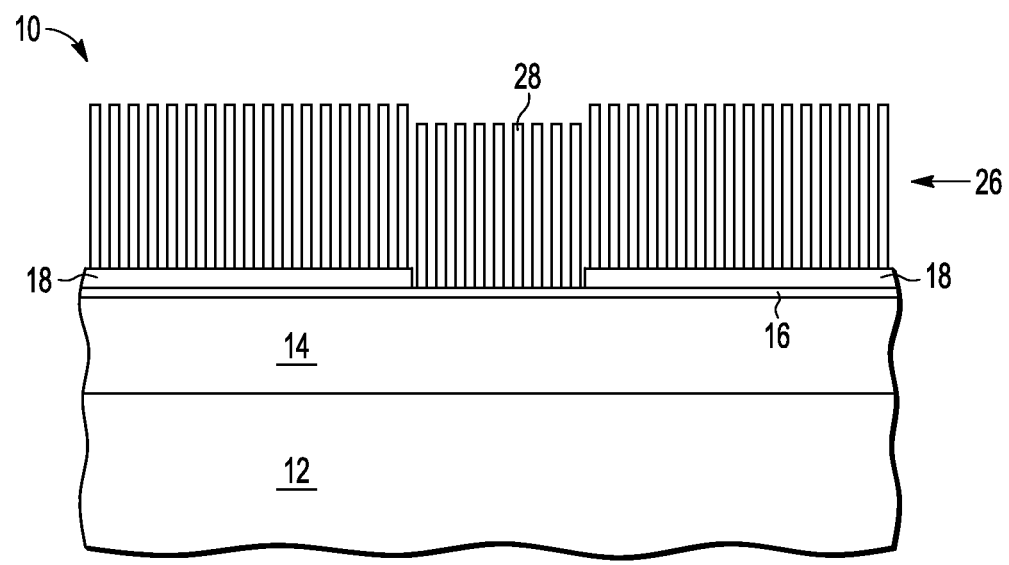
FIG. 7 illustrates the semiconductor device of FIG. 6 at a subsequent stage in processing, in accordance with one embodiment of the present invention.

FIG. 7 illustrates semiconductor device 10 of FIG. 6 at a subsequent stage in processing in which a heat cycle, i.e. anneal, is performed. During the heat cycle, seed layer 22 is absorbed by the underlying layer. For example, seed layer 22 is absorbed into conductive layer 16 within opening 22 and forms an alloy and is absorbed into dielectric layer 18 outside of opening 22. In one embodiment in which conductive layer 14 includes copper and conductive layer 16 includes titanium/tantalum, an alloy including cobalt, titanium, and tantalum is formed within opening 22 as a result of the anneal. The absorption of the seeds into the underlying layer provides protection against formation of any leakage path which may occur if the conductive seeds were to remain along the surface of dielectric layer 18.

Still referring to FIG. 7, note that a first plurality of conductive nanotubes of layer 26 is formed within opening 22 and thus on seeds which are on conductive layer 16 and a second plurality of conductive nanotubes of layer 26 is formed on seeds which are on dielectric layer 18. Due to the presence of dielectric layer 18, electrons are unable to enter the conductive nanotubes which are formed over dielectric layer 18. However, for those conductive nanotubes which are formed over conductive layer 16 and not over dielectric layer 18, electrons are able to enter the conductive nanotubes, assuming a top of the nanotubes are in contact with a conductor, which will be described below. Therefore, only the first plurality of conductive nanotubes of layer 26 are capable of transferring current between conductive layer 14 and a subsequently formed conductive layer over layer 26. That is, the first plurality of conductive nanotubes form a conductive via between conductive layer 14 and a subsequently formed conductive layer, as will be described below. The second plurality of conductive nanotubes of layer 26 therefore operate as an interlayer dielectric layer surrounding the conductive via. In this manner, different portions of a same layer, i.e. layer 26, may operate as the conductive via and the interlayer dielectric. Furthermore, note that the conductive nanotubes of the first plurality (those used as the conductive via) and the conductive nanotubes of the second plurality (those used as the interlayer dielectric) are not only of the same type but are also formed at the same time.

Figure 8:
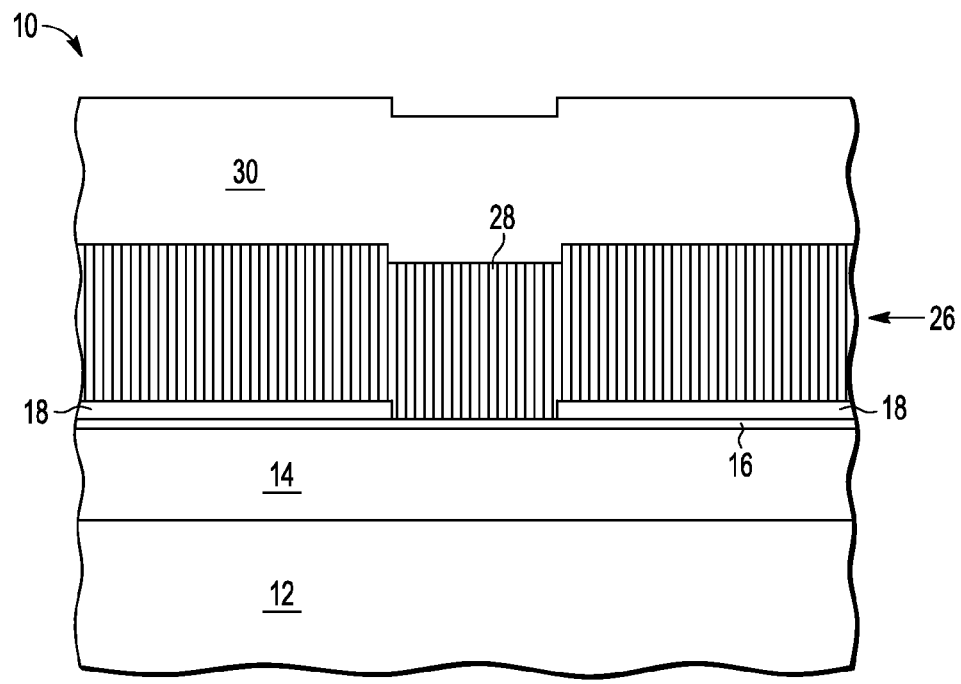
FIG. 8 illustrates the semiconductor device of FIG. 7 at a subsequent stage in processing, in accordance with one embodiment of the present invention.

FIG. 8 illustrates semiconductor device 10 at a subsequent stage in processing in which a dielectric layer 30 is formed over layer 26. In one embodiment, dielectric layer 30 is conformally deposited over layer 26. The next metal layer will be inlaid within dielectric layer 30. Therefore, in one embodiment, dielectric layer 30 may be a low-k dielectric layer. In one embodiment, dielectric layer 30 may be a layer of conductive nanotubes, similar to layer 26. In this embodiment, an additional dielectric layer, similar to dielectric layer 18, may first be formed over layer 26 such that dielectric layer 30 is formed over this additional dielectric layer.

Figure 9:
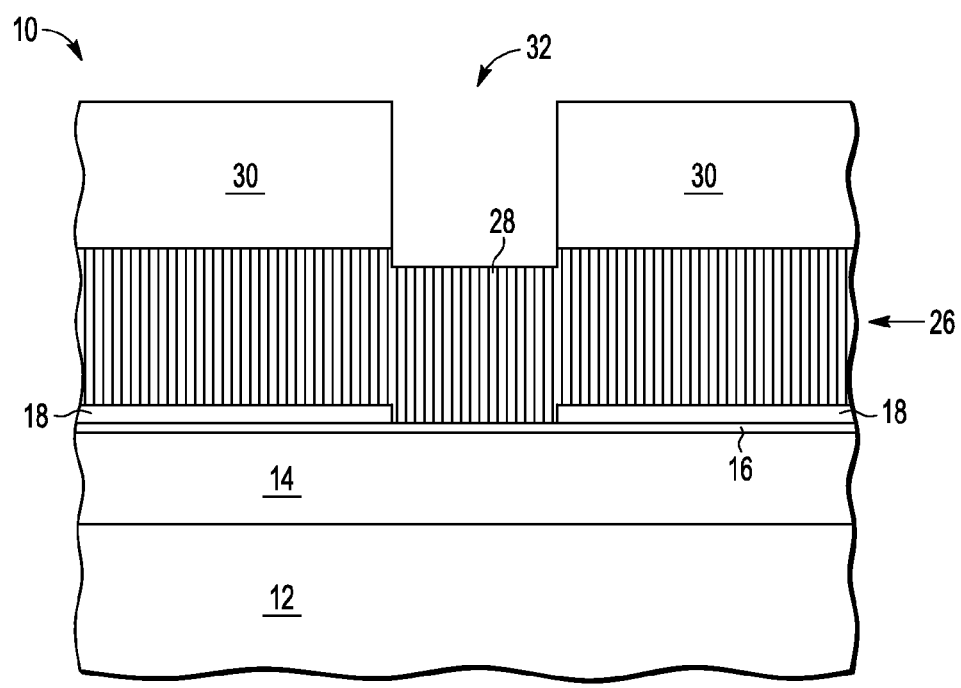
FIG. 9 illustrates the semiconductor device of FIG. 8 at a subsequent stage in processing, in accordance with one embodiment of the present invention.

FIG. 9 illustrates semiconductor device 10 at a subsequent stage in processing in which dielectric layer 30 is patterned and etched to form an opening 32 which extends through dielectric layer 30 (and any additional dielectric layer that may be present) to conductive nanotubes of layer 26.

Figure 10:
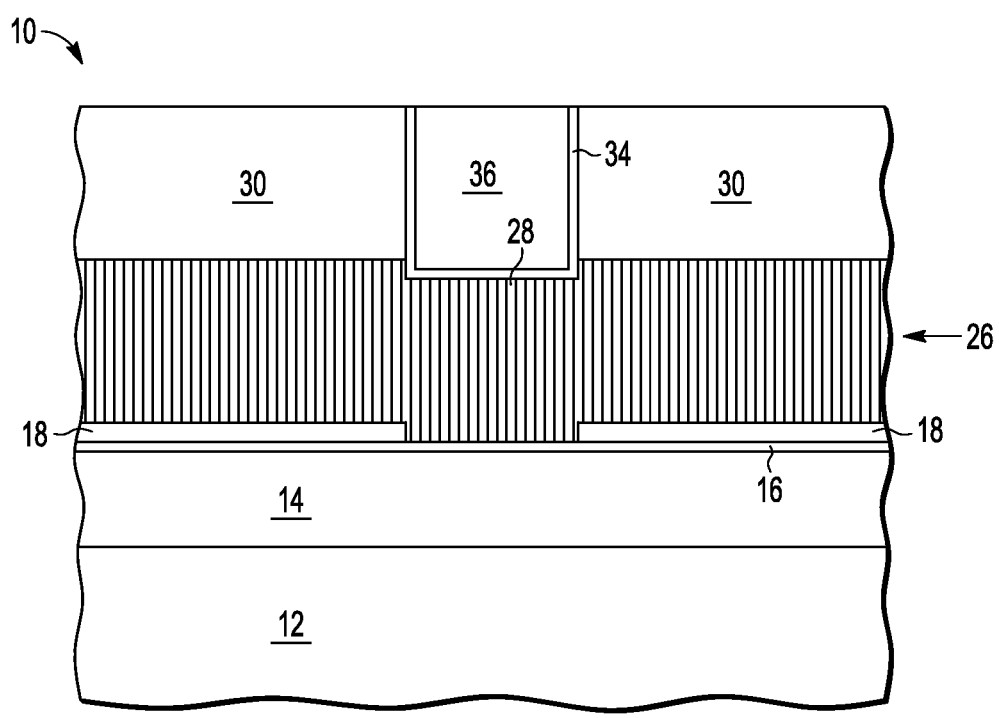
FIG. 10 illustrates the semiconductor device of FIG. 9 at a subsequent stage in processing, in accordance with one embodiment of the present invention.

FIG. 10 illustrates semiconductor device 10 at a subsequent stage in processing. In FIG. 10, a barrier layer 34 is formed within opening 32, along sidewalls of dielectric layer 30 and on the conductive nanotubes of layer 26 exposed by opening 32, and a conductive layer 36 is also formed within opening 32, over barrier layer 34. In one embodiment, barrier layer 34 and conductive layer 36 are formed by blanket deposition followed by a chemical mechanical polish. Barrier layer 34 and conductive layer 36 may collectively be referred to as a metal contact. In one embodiment, barrier layer 34 includes titanium, and, in one embodiment, conductive layer 36 includes copper. Therefore, note that a first plurality of conductive nanotubes of layer 26 which connect between conductive layer 16 and barrier layer 34 (and thus electrically contact both conductive layer 16 and barrier layer 34) operate as a conductive via (i.e. a via conductor) between conductive line 14 and conductive layer 36 and a second plurality of conductive nanotubes of layer 26 which surround the conductive via and which contact at least one of dielectric layer 18 or dielectric layer 30 operate as the interlayer dielectric.

Therefore, by now it can be appreciated how different portions of a homogeneous layer of conductive nanotubes is capable of operating as a conductive via or an interlayer dielectric. In this manner, the advantages of the nanotubes can be utilized for both the interlayer dielectric and the conductive via within a same homogeneous layer.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, conductive nanotubes may be used as the interlayer dielectric and conductive via for any one or more interconnect layers of semiconductor device 10. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a semiconductor device including a substrate; a conductive layer over the substrate; a first dielectric layer over the conductive layer, the dielectric layer having a first opening; a first plurality of conductive nanotubes over the dielectric layer; a second plurality of conductive nanotubes over the first opening in the dielectric layer; a second dielectric layer above the first plurality of conductive nanotubes and the second plurality of conductive nanotubes, the second dielectric layer having a second opening that is over the second plurality of conductive nanotubes; and a metal material in the second opening to form electrical contact between the conductive layer and the metal material through the second plurality of conductive nanotubes. Item 2 includes the semiconductor device of item 1, wherein the first plurality and second plurality of conductive nanotubes are homogeneous. Item 3 includes the semiconductor device of item 1, wherein the conductive nanotubes of the first and second pluralities of conductive nanotubes are carbon nanotubes. Item 4 includes the semiconductor device of item 1, wherein the first dielectric layer includes one of a group consisting of an oxide and nitride. Item 5 includes the semiconductor device of item 1, wherein an alloy between the second plurality of conductive nanotubes and the conductive layer includes cobalt. Item 6 includes the semiconductor device of item 5, wherein the metal layer includes a copper layer and a layer including titanium and tantalum. Item 7 includes the semiconductor device of item 1, wherein the metal material includes a first metal layer contacting a sidewall of the second opening and tops of the second plurality of conductive nanocrystals and a metal fill for filling the second opening. Item 8 includes the semiconductor device of item 7, wherein the metal fill includes copper.

Item 9 includes a method of forming a semiconductor device over a substrate, including forming a first conductive layer over the substrate; forming a first dielectric layer over the first conductive layer; forming a first opening in the first dielectric layer; depositing a seed layer over the first dielectric layer and in the first opening; forming a layer of conductive nanotubes from the seed layer over the first dielectric layer and over the first opening; forming a second dielectric over the layer of conductive nanotubes; forming an opening in the second dielectric layer over the first opening; and depositing conductive material in the second opening. Item 10 includes the method of item 9, wherein the step of forming the first conductive layer includes forming a copper layer; forming a titanium/tantalum layer on the copper layer. Item 11 includes the method of item 9, wherein the step of depositing the seed layer includes forming a cobalt layer. Item 12 includes the method of item 11, wherein the step of depositing the seed layer is further characterized by the cobalt layer including discrete seeds of cobalt that are spaced apart. Item 13 includes the method of item 9, wherein step of forming the layer of conductive nanotubes is further characterized by the conductive nanotubes including carbon nanotubes. Item 14 includes the method of item 13, wherein the step of forming the layer of nanotubes is further characterized by the layer of nanotubes being homogeneous. Item 15 includes the method of item 9, wherein the step of depositing conductive material includes depositing copper. Item 16 includes the method of item 15, wherein the step of depositing conductive material further includes depositing a barrier metal prior to depositing the copper. Item 17 includes the method of item 9, and further includes performing an anneal to cause the seed layer to form an alloy with the conductive layer. Item 18 includes the method of item 17, wherein the step of annealing causes the seed layer on the first dielectric layer to be absorbed by the first dielectric layer.

Item 19 includes a method of forming a via, including forming a conductive line over a substrate; forming an insulating layer over the conductive line; forming an opening in the insulating layer to expose a portion of the conductive line; forming a discrete seeds that are apart, a first plurality of the discrete seeds being on the portion of the conductive line that is exposed, a second plurality of the discrete seeds being on the insulating layer; simultaneously growing conductive nanotubes on the first plurality of discrete seeds and on the second plurality of discrete seeds; forming a metal contact to the conductive nanotubes grown from the first plurality of seeds, whereby the conductive nanotubes that are grown from the first plurality of seeds and that are in contact the metal contact function as the via, the via electrically connecting the metal contact to the conductive line. Item 20 include the method of item 19 and further includes forming an insulating layer over the conductive nanotubes, wherein the insulating layer has an opening and the metal contact is in the opening.

What is claimed is:

1. A method of forming a semiconductor device over a substrate, comprising:
   forming a first conductive layer over the substrate;
   forming a first dielectric layer over the first conductive layer;
   forming a first opening in the first dielectric layer;
   depositing a seed layer over the first dielectric layer and in the first opening;
   forming a layer of conductive nanotubes from the seed layer over the first dielectric layer and over the first opening;
   forming a second dielectric over the layer of conductive nanotubes;
   forming a second opening in the second dielectric layer over the first opening; and
   depositing conductive material in the second opening,
   wherein a first portion of the conductive nanotubes extends from the first dielectric layer to the second dielectric layer and a second portion of the conductive nanotubes extends from the first conductive layer to the conductive material.

2. The method of claim 1, wherein the step of forming the first conductive layer comprises:
    forming a copper layer; and
    forming a titanium/tantalum layer on the copper layer.

3. The method of claim 1, wherein the step of depositing the seed layer comprises forming a cobalt layer.

4. The method of claim 3, wherein the step of depositing the seed layer is further characterized by the cobalt layer comprising discrete seeds of cobalt that are spaced apart.

5. The method of claim 1, wherein step of forming the layer of conductive nanotubes is further characterized by the conductive nanotubes comprising carbon nanotubes.

6. The method of claim 5, wherein the step of forming the layer of nanotubes is further characterized by the layer of nanotubes being homogeneous.

7. The method of claim 1, wherein the step of depositing conductive material comprises depositing copper.

8. The method of 7, wherein the step of depositing conductive material further comprises depositing a barrier metal prior to depositing the copper.

9. The method of claim 1, further comprising performing an anneal to cause the seed layer to form an alloy with the conductive layer.

10. The method of claim 9, wherein the step of annealing causes the seed layer on the first dielectric layer to be absorbed by the first dielectric layer.

11. The method of claim 1, wherein the first portion functions as a conductive via and the second portion functions as an interlayer dielectric surrounding the conductive via further comprising forming an insulating layer over the conductive nanotubes, wherein the insulating layer has an opening and the metal contact is in the opening.

12. A method of forming a via, comprising:
    forming a conductive line over a substrate;
    forming an insulating layer over the conductive line;
    forming an opening in the insulating layer to expose a portion of the conductive line;
    forming a discrete seeds that are apart, a first plurality of the discrete seeds being on the portion of the conductive line that is exposed, a second plurality of the discrete seeds being on the insulating layer;
    simultaneously growing conductive nanotubes on the first plurality of discrete seeds and on the second plurality of discrete seeds; and
    forming a metal contact to the conductive nanotubes grown from the first plurality of seeds, whereby the conductive nanotubes that are grown from the first plurality of seeds and that are in contact with the metal contact function as the via, the via electrically connecting the metal contact to the conductive line,
    the method further comprising:
    forming an insulating layer over the conductive nanotubes, wherein the insulating layer has an opening and the metal contact is in the opening, and wherein the conductive nanotubes grown from the second plurality of seeds function as an interlayer dielectric surrounding the via.

* * * * *